(12) United States Patent
Bass et al.

(10) Patent No.: US 6,207,887 B1
(45) Date of Patent: Mar. 27, 2001

(54) MINIATURE MILLIWATT ELECTRIC POWER GENERATOR

(75) Inventors: John C. Bass; Norbert B. Elsner, both of La Jolla, CA (US)

(73) Assignee: Hi-2 Technology, Inc., San Diego, CA (US)

( * ) Notice: Subject to any disclaimer, the term of this patent is extended or adjusted under 35 U.S.C. 154(b) by 0 days.

(21) Appl. No.: 09/349,428

(22) Filed: Jul. 7, 1999

(51) Int. Cl.$^7$ .................................................. H01L 35/34
(52) U.S. Cl. .......................... 136/201; 136/205; 136/239; 136/240; 136/237
(58) Field of Search ..................................... 136/201, 203, 136/205, 237, 239, 240; 204/192.15, 192.17

(56) References Cited

U.S. PATENT DOCUMENTS

| | | | |
|---|---|---|---|
| 3,780,425 | 12/1973 | Penn et al. ............................... | 29/573 |
| 3,781,176 | 12/1973 | Penn et al. ............................. | 136/212 |

OTHER PUBLICATIONS

Elsner, N. B., Bass, J. C., Ghmaty, C. C., Morris, Baker, N., and Bass, J. A., Fabrication of Milliwatt Modules, 18th International Conference of Thermoelectrics, Aug. 28–Sep. 2, 1999, pp. 505–508.*

* cited by examiner

Primary Examiner—Kathryn Gorgos
Assistant Examiner—Thomas H. Parsons
(74) Attorney, Agent, or Firm—John R. Ross; John R. Ross, III

(57) ABSTRACT

A miniature thermoelectric module for generating electric power from low power heat sources in the range of a fraction of a Watt to a few Watts. The module comprises an array of thermoelectric elements, each element having a cross section of less than 0.001 square inch and a length of at least 0.25 inch. The elements are separated from each other with a polyimide insulator sheet in a checkerboard array. In a preferred embodiment, the modules are fabricated by hot pressing a stack of alternating plates of p and n doped thin plates all separated by thin sheets of a polyimide insulator material to produce a pressed stack of p and n doped layers. The stack is then sliced to produce layered plates which are then stacked with insulating polyimide layers positioned between the layered plates to produce the checkerboard array of p and n thermoelectric elements. Contacts are applied to electrically connect all of the elements. In a preferred embodiment, the contacts are applied by first sputtering a thin layer of gold, then welding gold tabs, and then blasting away the excess sputtered gold. In one preferred embodiment, the contacts connect all of the elements in series. In another preferred embodiment, the elements are connected in a series-parallel circuit. In a preferred embodiment, the module is utilized in a generation unit with a 1-Watt radioactive heat source to produce about 40 mW of electric power at 5.5 Volts which is converted to 12 Volts with a DC to DC converter.

31 Claims, 8 Drawing Sheets

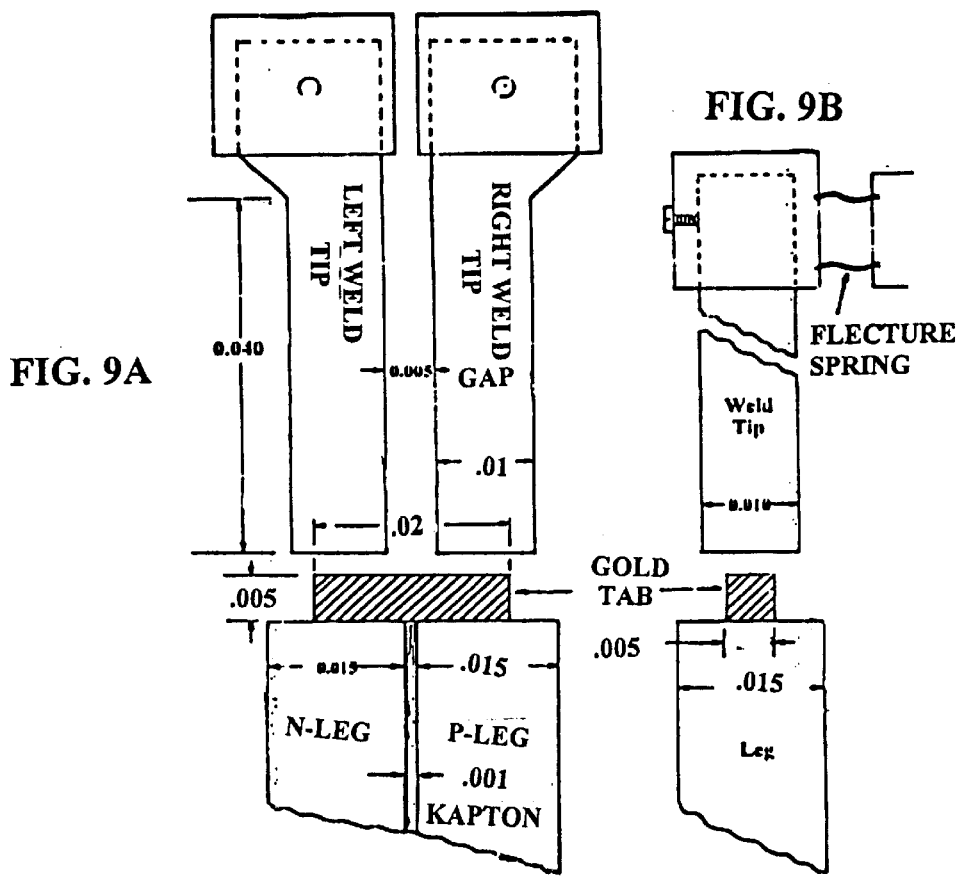
FIG. 9A
FIG. 9B
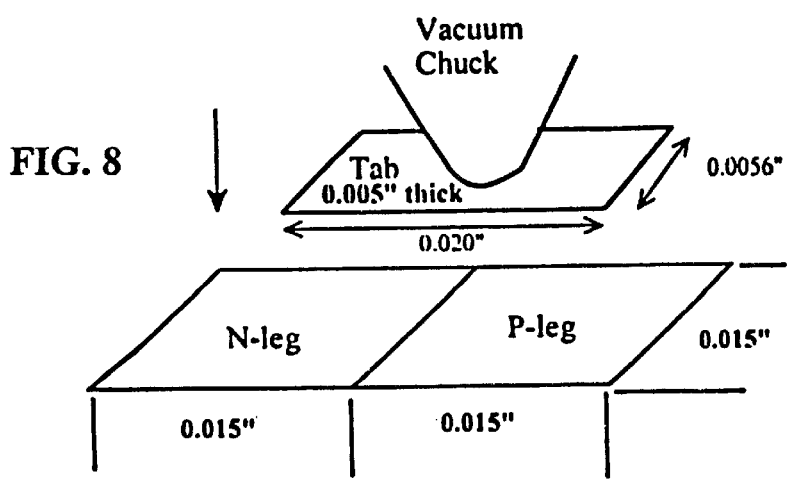
FIG. 8

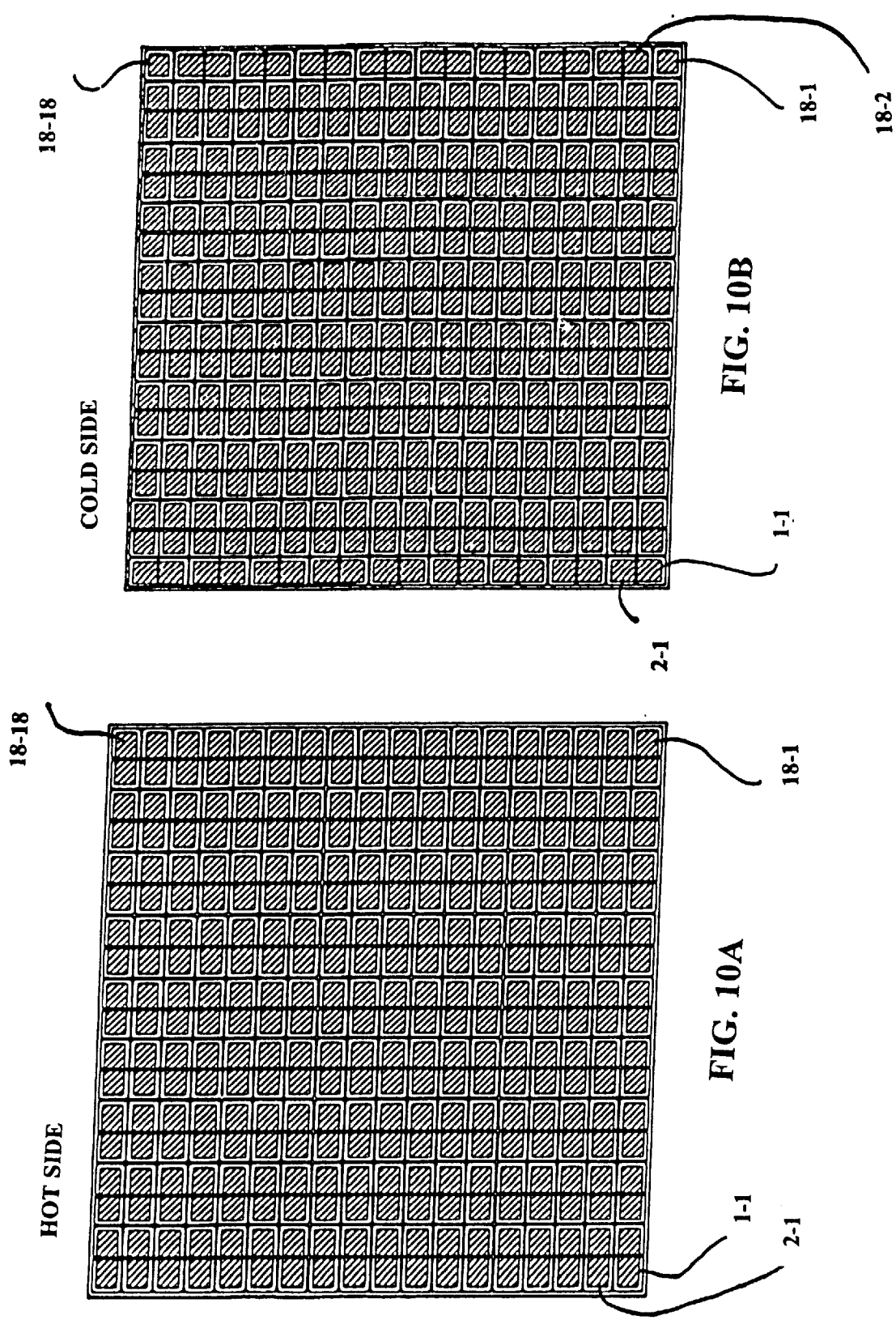

MINIATURE MILLIWATT ELECTRIC POWER GENERATOR

STATEMENT REGARDING FEDERALLY SPONSORED RESEARCH OR DEVELOPMENT

This invention was made in the course of or under Contract No. DE-ACO3-98SF21556 and the United States Government has rights in the invention.

BACKGROUND OF THE INVENTION

1. Field of the Invention

This invention relates to thermoelectric devices and in particular to very small thermoelectric generator devices.

2. Description of the Related Art

The generation of electricity by the application of heat at the junction of two dissimilar materials has been known for 178 years. Thermoelectric modules fabricated from semiconductor materials can convert heat into electricity with efficiencies of up to six percent. Despite efficiencies much lower than some other electric generators, these devices can have many practical applications. Waste heat is generally free; so low efficiencies may not be important. In many remote locations thermoelectric devices may be the most economical means of generating electricity even if a source of heat must be provided. Thermoelectric devices can be made very reliable and very small. Many space vehicles have their instruments powered by thermoelectric devices, which typically use heat produced by radioactive sources such as Pu-238 sources. Small prototype thermoelectric devices using radioactive sources have been produced for the purpose of being implanted in people for providing power for pacemakers. One such example is described in U.S. Pat. Nos. 3,780,425 and 3,781,176. This device was proposed as a thermoelectric battery for a cardiac pacemaker. These patents proposed a method of manufacture that proposed the use of epoxy impregnated paper insulators between thermoelectric elements and the use of a photoresist method of applying contacts.

The United States acting through NASA and JPL are seeking to develop a small power source for a Mars vehicle. The plan is to utilize an existing off-the-shelf radioactive heat unit (called the 1-Watt RHU) which was developed by the Los Alamos National Laboratory, Los Alamos, N. Mex. The 1-Watt RHU produces 1 Watt of thermal power and is used in space to heat instruments so that they will not freeze. The radioactive element in the 1-Watt RHU is Pu-238, which is a very dangerous material, but many tests have proven that the containment vessel, which contains and protects the Pu-238, is so reliable that it would survive an explosion on lift-off and the maximum possible heating on reentry.

Studies have been conducted to combine existing thermoelectric modules with this heat source to produce about 40 mW of electric power at 5.5 Volts for space uses. No such module exists. In fact, one study concluded that the "prospects . . . [of satisfying these requirements] based on a 1-Watt heat source are not encouraging". (Schock and Or, Parametric Design Study of "Power Stick" and Its Derivatives, CONF 95011, American Institute of Physics, 1995)

What is needed is a miniature thermoelectric module capable of reliably producing for many years 10's of milliwatt power from a very low power heat source such as a heat source generating heat at a fraction of a Watt to a few Watts.

SUMMARY OF THE INVENTION

The present invention provides a miniature thermoelectric module for generating electric power from low power heat sources in the range of a fraction of a Watt to a few Watts (thermal). The module comprises an array of thermoelectric elements, each element having a cross section of less than 0.001 square inch and a length of at least 0.25 inch. The elements are separated from each other with a polyimide insulator sheet in a checkerboard array. In a preferred embodiment, the modules are fabricated by hot pressing a stack of alternating plates of p and n doped thin plates all separated by thin sheets of a polyimide insulator material to produce a pressed stack of p and n doped layers. The stack is then sliced to produce layered plates which are then stacked with insulating polyimide layers positioned between the layered plates to produce the checkerboard array of p and n thermoelectric elements. Contacts are applied to electrically connect all of the elements. In a preferred embodiment, the contacts are applied by first sputtering a thin layer of gold, then welding gold tabs, and then blasting away the excess sputtered gold. In one preferred embodiment, the contacts connect all of the elements in series. In another preferred embodiment, the elements are connected in a series-parallel circuit to enhance reliability. In a preferred embodiment, the module is utilized in a generation unit with a 1-Watt (thermal) radioactive heat source to produce about 40 mW of electric power at 5.5 Volts which is converted to 12 Volts with a DC to DC converter.

BRIEF DESCRIPTION OF THE DRAWINGS

FIGS. 6, 7, 8, 9A and 9B show steps in the process of fabricating a thermoelectric module according to the present invention.

FIGS. 10A and 10B show a preferred connection pattern to connect all of the elements in series.

DETAILED DESCRIPTION OF PREFERRED EMBODIMENTS

Preferred embodiments of the present invention can be described by reference to the figures.

First Preferred Embodiment

40-mW Thermoelectric Module—18×18 Elements

Figure 1:
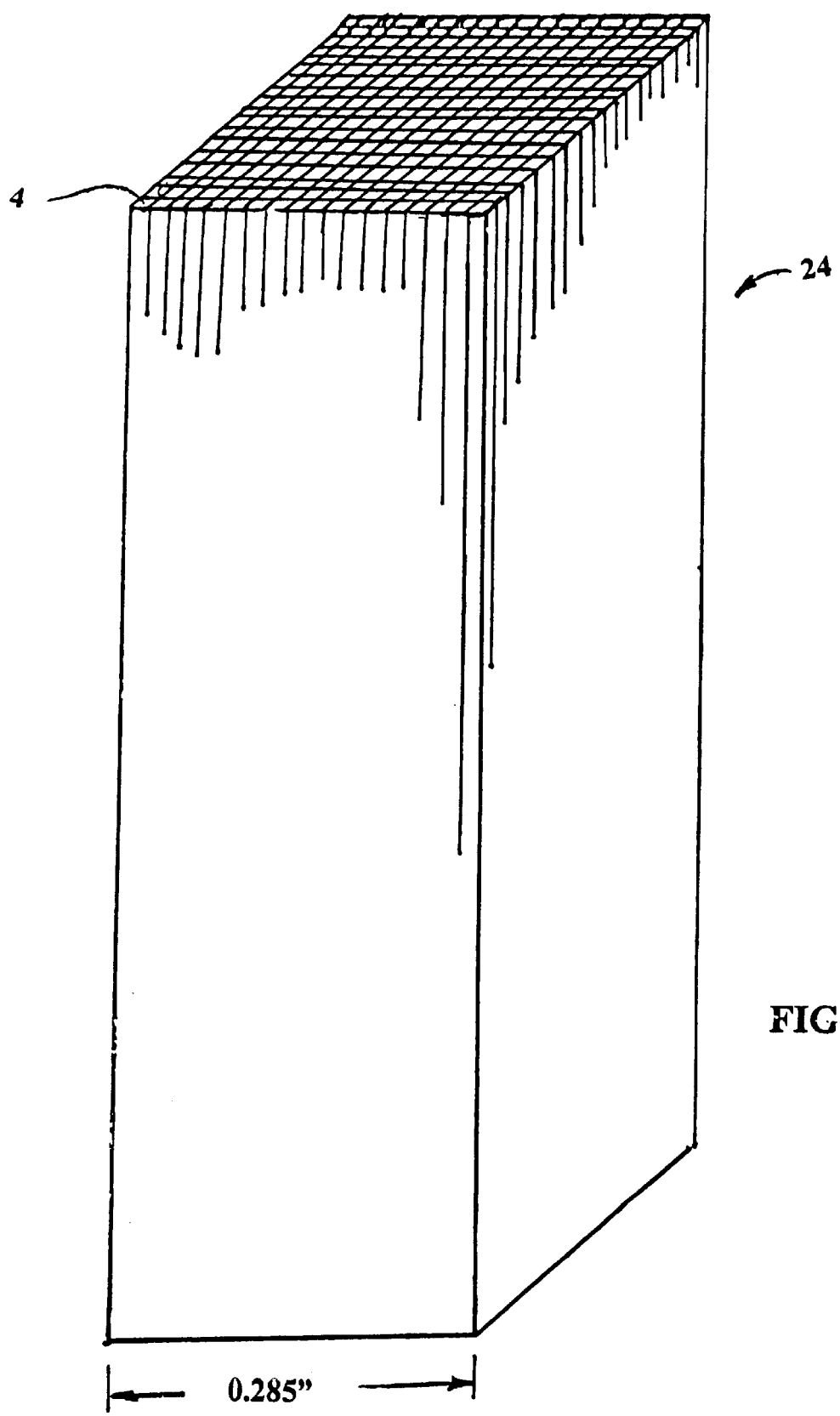
FIG. 1 is a drawing of an array of thermoelectric elements.

FIG. 1 is a drawing of an array of thermoelectric elements built and tested by Applicants. This module is capable of generating 40 mW of electric power from a 1 Watt (thermal) RHU source discussed above in the Background section. The module 24 is an 18×18 array of bismuth-telluride thermoelectric elements 4. The module is 0.9 inches long and its cross section area is 0.285×0.285 inch. The element cross section is 0.015 inch×0.015 inch. The module 24 comprises 324 elements 4.

Fabrication of Thermoelectric Module

Described below is a preferred fabrication process for fabricating the 18×18 element thermoelectric modules 24 shown in FIG. 2.

Bismuth-Telluride

The process is started by preparing 3-inch×1.5-inch×1.2-inch bismuth-telluride pucks of both n-doped material and p-doped material.

The N-type alloy is a solid solution of $Bi_2Te_3$ and $Bi_2Se_3$ and the amount of $Bi_2Se_3$ can vary from 7 to 20 molecular percent. The alloys are doped with 0.1 percent iodoform ($CHI_3$). The P-type alloy is a solid solution of $Bi_2Te_3$ and $Sb_2Te_3$ and the amount of $Sb_2Te_3$ can vary from 70 to 90 molecular percent. (An alternate formula is to substitute 5 molecular percent $Sb_2Se_3$ for the $Sb_2Te_3$.) The alloy is doped with 0.1 wt. percent Pb to produce the P-type alloy.

Each of the P and N type constituents are weighed out to at least three places (i.e., with an accuracy of 0.001 gram) and loaded into quartz ampoules. After the ampoules are sealed off, the constituents are melted at a temperature greater than 700 C. (preferably about 730 C.) for more than one hour (preferably about 90 minutes) in a high-temperature rocking furnace. The ampoules are rocked periodically to insure homogenization. The ingots produced are removed from the ampoules and ground to minus 270 mesh in an inert gas glove box.

The powders resulting from the grinding are poured into a steel die and the die and a plunger are loaded into a vacuum hot press. The chamber is evacuated to less than $1 \times 10^{-3}$ torr and the die is heated to 400 C. A load of approximately 9,000 psi is applied and held for four hours. After cool down, the hot pressed puck in rectangular parallelepiped form is removed from the die. The puck is then cut to dimensions of 3-inch ×1.5 inch×1.2-inch. The pressing direction is in the 1.5-inch dimension. (It is important that in use, the temperature gradient is perpendicular to the pressing direction.)

Thin Plates from Pucks

Figure 5:
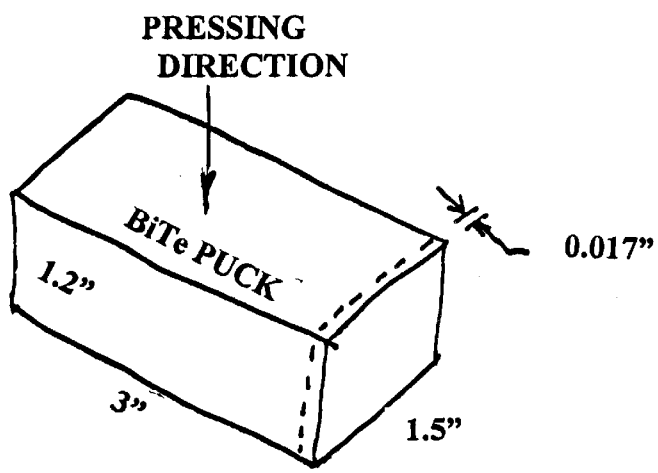
FIG. 5 is a bismuth telluride puck.

Next, very thin precise 0.017-inch plates are cut from the pucks using an inner diameter (ID) saw to produce 1.5 inch×1.2 inch×0.017 inch slices as shown in FIG. 5. (An inner diameter saw is a circular saw with the saw teeth on an inner diameter. These saws are much more stable at the cutting edge than typical circular saws.) The cut is in a plane parallel to the pressing direction. These plates are then held with a vacuum chuck and lapped using 600 grit wet-dry paper to 0.0150+/−0.0005 inch on a granite tooling block. The vacuum chuck includes adjustable ceramic stops to prevent overlapping. The plates are cleaned with acetone.

Stacking P and N Plates with Kapton Insulator Sheets

Figure 6:
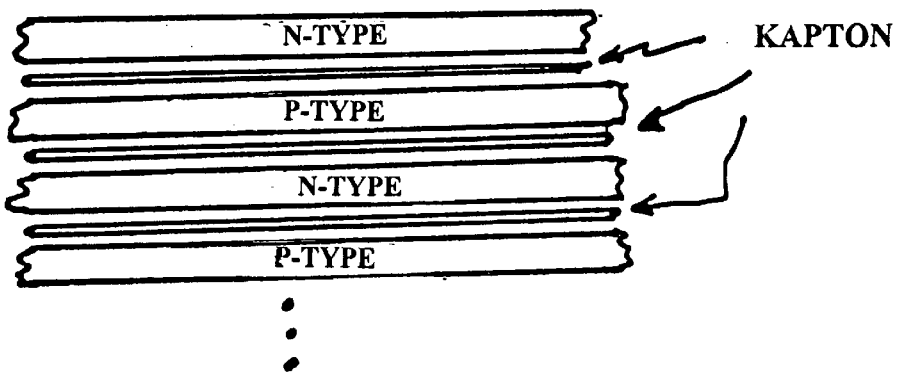

When 9 n-type plates and 9 p-type plates have been prepared, they are stacked as shown in FIG. 6 with one sheet of 100 kJ KAPTON self-bonding polyimide film (with a film thickness of 0.001 inch) separating each plate. KAPTON® is a trademark of Dupont Corp. with offices in Wilmington, Del. and is used to describe a well-known polyimide material. The use of self-bonding polyimide film is a very important improvement in the art of fabricating small thermoelectric elements. The earlier procedure required application of a liquid epoxy. This procedure was much more labor intensive and it was very difficult to obtain consistent thickness of the layers.

Pressing the Plates

The stack of 18 plates are then placed in an alignment fixture and pressed in a vacuum hot press at 350 C. and 200 psi for 30 minutes and removed after cooling.

Slicing the Stacked Pressed Plates

The stack of 18 plates is then sliced into 0.017-inch plates with the cut being perpendicular to the planes of the stacked plates to produce 18 layered plates, each plate having 18 p and n layers. The layered plates are then lapped as described above to 0.0150+/−0.0005 inch.

Stacking the Layered Plates

Figure 7:
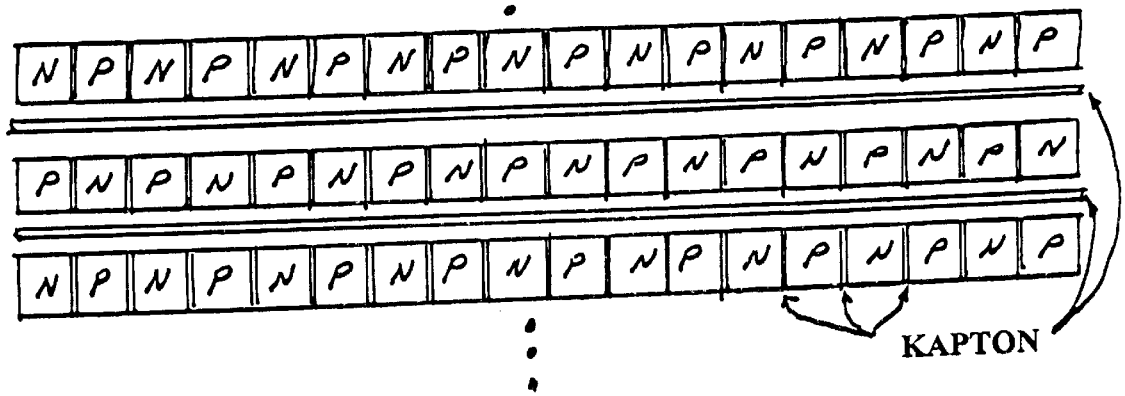

The layered plates are then stacked as shown in FIG. 7 with a sheet of 100 kJ KAPTON polyimide film separating each layered plate from its neighbor plate. The plates are stacked to produce the checkerboard pattern as shown in FIG. 7 alternating the plates with each p element facing an n element on all sides and vice versa.

Pressing the Stacked Layered Plates

Next the stacked layered plates are placed in an alignment fixture and pressed as described above to form an array of 18×18 alternating p and n type elements. The sides of the array are then lapped flat to remove any protrusions of KAPTON and the ends are squared on an ID saw to the desired length, in this embodiment, 0.9 inch for a 40 mW module as shown in FIG. 1. The cold side (top) cross section is shown in FIG. 10B and the hot side (bottom) cross section is shown in FIG. 10A.

Application of Contacts

In this embodiment, all of the N and P type elements are connected in series with contacts at both ends of the module. The procedure is as follows:

Surface Lapped, Abraded and Sputtered with Gold

The top and bottom surfaces of the array of elements are lapped smooth and flat. Then the surfaces are slightly roughened by light sand blasting for about 2 minutes with fine abrasive such as aluminum oxide or silicon carbide. An extremely thin (about 2 to 3 microns) deposit of gold is sputtered onto each surface. The underlying N and P elements are slightly different shades of gray and can be visually observed in the checkerboard pattern through the thin gold film.

Applying Gold Tabs

In this preferred embodiment, the individual elements 4 are connected in series using very tiny gold tabs having dimensions of 0.020 inch×0.0056 inch×0.005 inch. The tab is placed across the ends of an N-element and a P-element as shown in FIG. 8 with vacuum tweezers. This is done under a microscope using a commercially available tab positioner. When a tab is in place it is welded to the two elements using a microscopic parallel-gap spot weld tip as shown in FIGS. 9A and 9B. The weld head is suspended from flexure springs as shown in FIG. 9B to help assure that the force applied on the tab is within the proper range of about 0.1 pound. As the gold is heated, a bond forms at the contact between the tab and the two elements. Applicants have confirmed that the application of the very thin layer of sputtered gold greatly improves the tab joints. The thin gold layer prevents oxidation of the bismuth telluride based alloys. Also, Applicants believe that the gold and the bismuth telluride form a eutectic that melts at a temperature lower than the gold or the bismuth telluride helping to improve the contact. An alternate to applying the tabs with a microscopic spot welder is to cover the tabs with a glass tool transparent to a laser beam and using a precision laser to weld the tabs to the elements. Applicants' experiments have indicated that ultrasonic techniques do not work as well as the above described methods, but this technique is a potential method of attaching the tabs.

The Pattern

FIGS. 10A and B show a preferred connection pattern to connect all of the elements in series. For example, we can number the 324 elements from 1-1 to 18-18 with 1-1 at the bottom left of both hot and cold sides with the bottom right element being 18-1 and the top right being 1-18 for both hot and cold sides. With the connections shown in FIGS. 10A and B, electron flow will be from the cold side to the hot side through element 18-1 and then back from the hot side to the cold side through element 17-1 then back to the hot side through element 16-1. At element 1-1, the electrons flow is from hot to cold then back to hot in element 2-1, then back to cold through element 2-2 and so on to element 18-2 where it flows from hot to cold. The electrons then flow from cold to hot through element 18-3 then back to cold through element 17-3. This pattern is followed until the current flows from the hot side to the cold side through element 18-18.

Removal of Excess Sputtered Gold

Once the contacts have been welded on the hot and cold sides of the module, each of the hot and cold sides are lightly sand blasted to remove the thin layer of gold which remains between the contacts. This step de-shorts the module so that a single series electric circuit is produced.

Attachment of Leads

Figure 11:
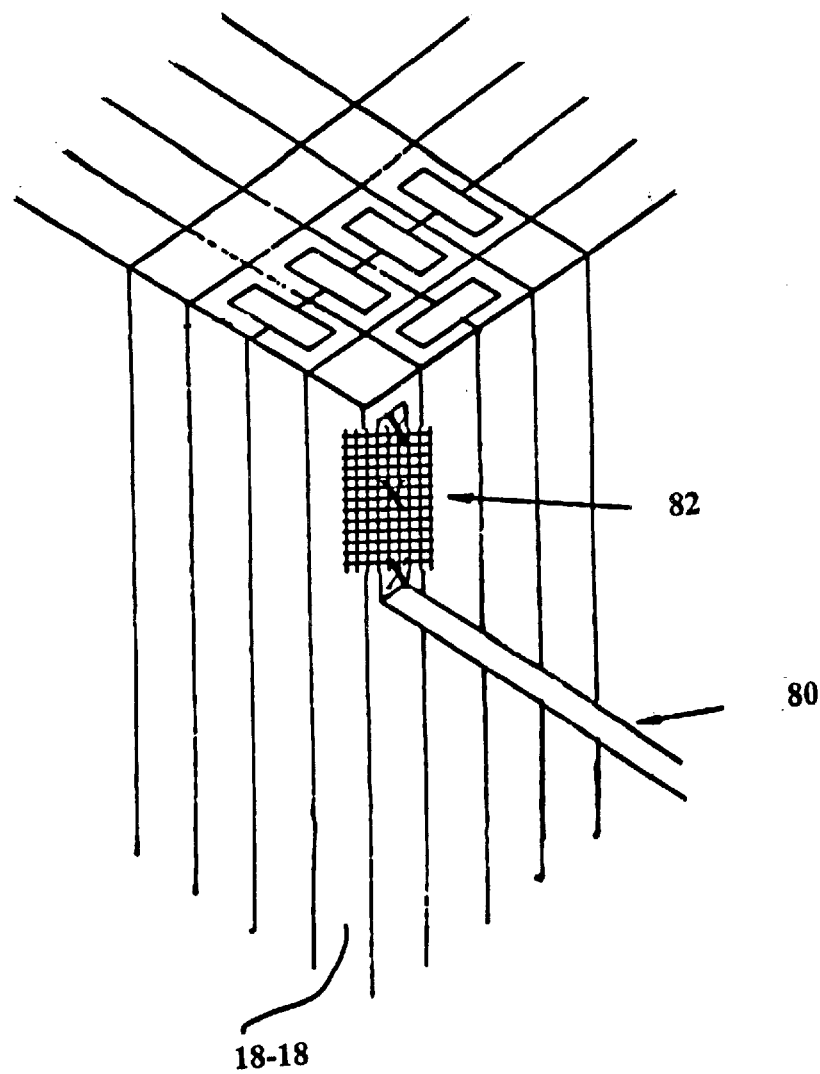
FIG. 11 shows how the leads are attached to the module.

Leads 80 in this embodiment are attached at the cold ends of elements 18-1 and 18-18. The attachment of the lead to 18-18 is shown in FIG. 11. The leads in this case are gold weave power leads. The leads are spot welded to the tip of element 18-1 and to the tip of element 18-18. A gold wire mesh 82 is appoxied to the connection for additional support.

Generating Unit

Figure 2:
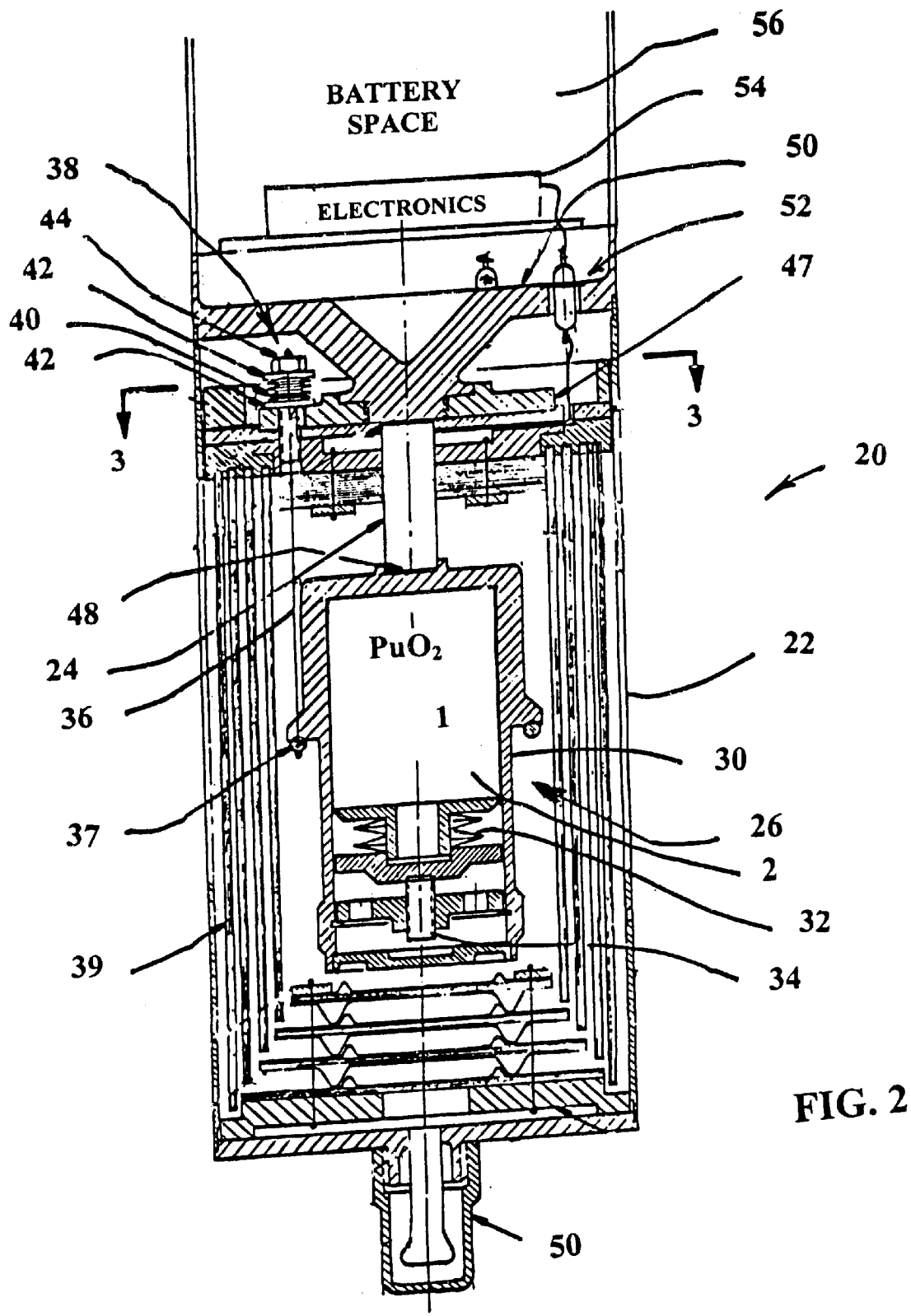
FIG. 2 is a preferred embodiment of the present invention for generating 40 milliwatts of electric power from a 1-Watt (thermal) radioactive heat source.

FIG. 2 is a drawing of the generating unit 20 of this first preferred embodiment. Cylindrical shell 22 contains thermoelectric module 24 located near the top. RHU 26 is shown centrally positioned. The RHU is a right cylinder, 26 mm in diameter and 32 mm long with a weight of 40 grams. The plutonium oxide source 23 is sealed in a polished cylindrical aluminum capsule holder 30. The cylindrical ceramic oxide fuel is pressed against the upper wall of the cylinder at 200 psi with Belleville spring 32 and bolt 34. This unit produces 1 Watt of thermal power from the radioactive (alpha) decay of U-238, which has a half-life of 87.5 years.

Figure 4:
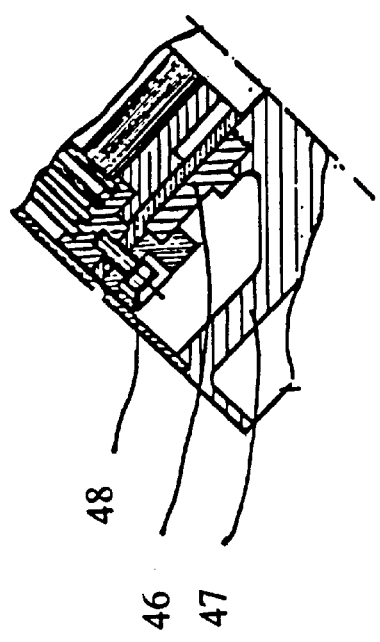
FIGS. 3 and 4 are sectional views of FIG.2.
Figure 3:
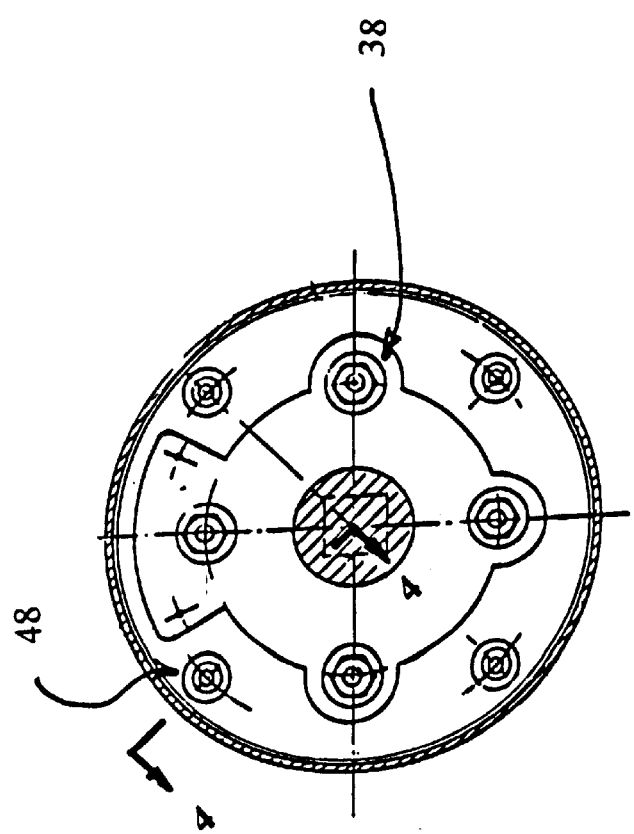

Thermoelectric module 24 is held in tight thermal contact, about 200 psi, with RHU 26 with four titanium tie wires 36 which attach to container 30 on shoulder element as shown at 37 in FIG. 2. The proper tension is applied with a bolt and Belleville spring arrangement shown at 38 in FIG. 2. This arrangement includes Belleville springs 40, two washers 42 and bolt 44. Collar 46 which screws onto copper base 47 is attached to shell 22 with four bolts as shown in FIG. 3 and FIG. 4.

A very thin (0.01-inch) thermally conductive electric insulator (boron-nitride) is placed between the bottom of module 24 and RHU 26 as shown at 48. The top of module 24 is bonded to copper base 47 with a thermally conductive epoxy, which is also an electric insulator.

Thermal insulation of the heat source is provided by multiple foils of aluminized Kapton separated by thin sheets of ceramic paper (not shown). The volume remaining in vessel 22 is preferably evacuated or it may be back filled with Xenon gas through pinch off tube 50. The inner surface of shell 22 is preferably gold plated to increase its spectral reflectance. The insulation system only allows about 14% of the energy produced by the radioisotope fuel to escape directly to generator shell 22.

Both the positive lead and the negative lead from module 24 pass through vacuum tight feed-through sections 52 in base 50 and connect to electronics card 54.

Output

About 82 percent of the heat from the 1-Watt (thermal) source flows through the elements of the module. The cold surface is assumed to be 25 C. and the temperature at the hot surface will be about 250 C. The total power produced with these parameters is about 40 milliwatts. With all of the elements in series as described, the voltage produced with a matched load is 5 Volts. The output of electronics card 54 provides charging power to rechargeable batteries (not shown) but located in battery space 56. The 5 Volts could be increased to higher voltages such as 12 volts with a DC to DC converter such as Model No. PT6673 supplied by Power Trends Inc. with offices in Warrenville, Ill.

More Power from Smaller Modules

Figure 12A:
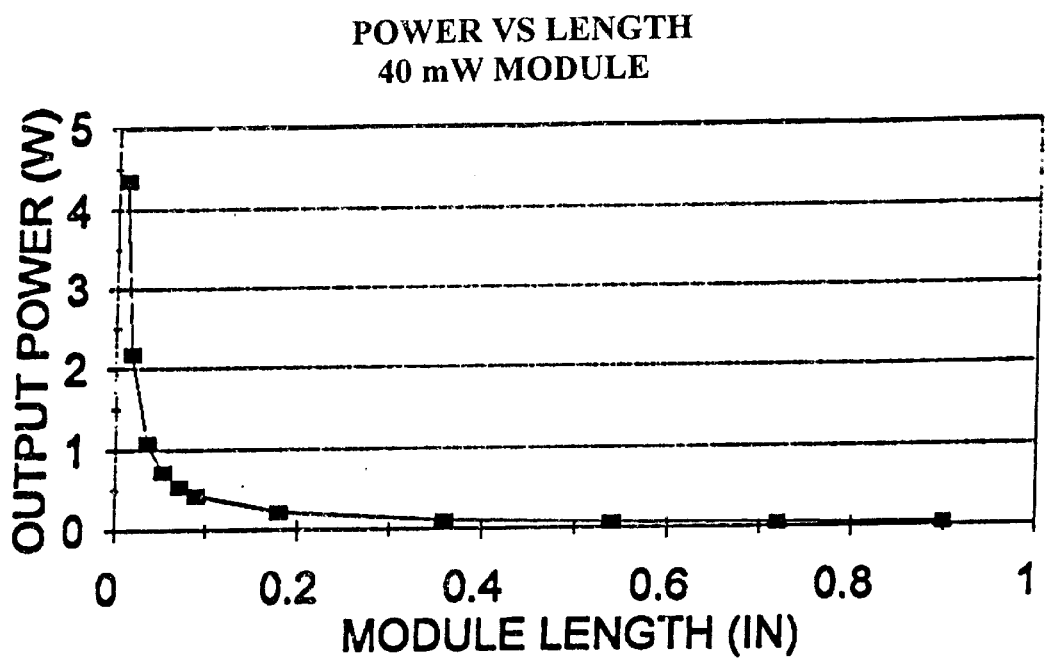
FIGS. 12A and 12B show the result of shortening the module length.
Figure 12B:
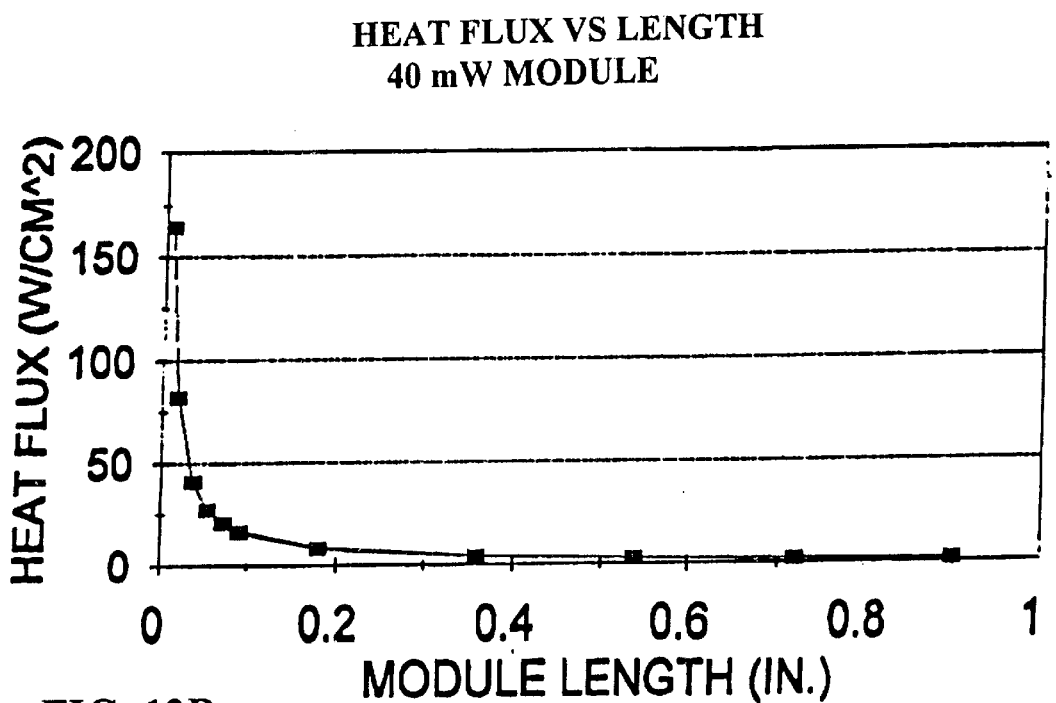

A feature of the above-described thermoelectric module is that making it shorter can increase the power produced by the module. For example, if the above module is cut in half perpendicular to the long axis and additional contacts and leads applied to each half, each half will produce about twice as much power as the original module. Each of the half modules, however, will require twice as much heat flux as the original. So each half should be provided with 2 Watts (thermal) and each half will produce about 80 milliwatts. This effects continues for even smaller modules as shown in FIGS. 12A and 12B. There are practical limits to this relationship. At some point contact resistance becomes significant compared to total resistance, which leads to inefficient generation. (A practical limit is about 10 percent.) Also attaching the gold contact contaminates a small but finite length of thermoelectric material. The length of the element should be large compared to this contaminated section.

Series-Parallel Circuits

Figure 13A:
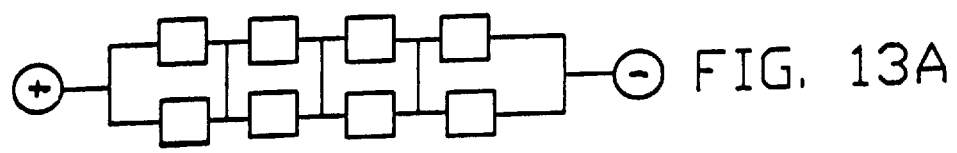
FIGS. 13A and 13B show two methods to connecting modules or sub-modules.
Figure 13B:
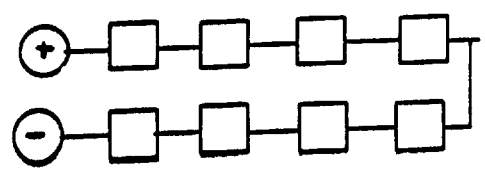

The above-described embodiments are series circuits in which all the elements are connected in series. This is a preferred arrangement because the few millivolt output of each of a few hundred elements when added in series produce an output in the range of several volts. The disadvantage of a strict series circuit is that if one contact fails open, all output of the module is lost. These series connected units can be very reliable and some have operated in very remote locations for 15 years; however, in some cases extra reliability may be called for. To make a module less prone to total failure various series-parallel circuits can be used. A series-parallel circuit of eight sub-modules can be provided such as that shown in FIG. 13A. This circuit will produce a voltage output equal to one-half of that which would have been produced if all elements were in series. However, if one contact is lost, only one-eighth of the power output is lost. FIG. 13B shows all the elements in series.

Masking

In a preferred embodiment described above, the entire surface of the array of elements is sputtered with gold prior to applying the gold tabs. After the gold tabs are applied, the sputtered gold that is not covered by the gold tabs is removed by sand blasting. As an alternative to sputtering the entire surface of the array of elements with gold, a metal mask can be placed over the surface of the array of elements prior to sputtering the array with gold. The metal mask is magnetically attached to the module and has a pattern that is cut to allow some of the sputtered gold to contact the module. The rest of the sputtered gold is prevented from contacting the module because it is stopped by the surface of the mask.

In a preferred embodiment, the pattern cut into the metal mask allows the sputtered gold to form contact pads on each of the elements. The metal mask is then removed. A circuit is then established connecting the contact pads by welding gold tabs between them, as previously described in above embodiments.

In another preferred embodiment, the pattern cut into the metal mask allows the sputtered gold to form the actual circuit that connects the elements. The metal mask is then removed, revealing the circuit on the module.

Utilizing Photoresist

It is also possible to utilize photoresist with the present invention. In one embodiment, a coating of photoresist is applied to the array of elements. The photoresist is then covered with a pattern representing locations of the contact pads at the end of each element. The photeresist is then exposed to ultraviolet light. The part of the photoresist that is exposed to the ultraviolet light hardens. The part of the photoresist that is covered by the pattern remains soluble. The pattern is then removed and the module is rinsed with a solvent, which causes the soluble part of the photoresist to dissolve. This leaves a hardened layer of photoresist covering the entire array of elements; however, over each individual element there is a hole in the photoresist representing the location of a contact pad. The photoresist-covered array of elements is then sputtered with gold and contact pads are formed on the end of each element where there are holes in the photoresist. The hardened layer of photoresist is then dissolved in a second solvent leaving behind an array of elements with gold contact pads. A circuit is then established connecting the contact pads by welding gold tabs between them, as previously described in above embodiments.

In another preferred embodiment, the pattern that covers the photoresist represents the actual circuit that connects the elements. Therefore, when the module is sputtered with gold, the circuit is imparted to connect the elements. The hardened layer of photoresist is dissolved in a second solvent as described above.

Electroplating

To reinforce the thickness of the sputtered gold, it is possible to electroplate the module after it has been sputtered with gold. For example, in a preferred embodiment described above, the pattern cut into the metal mask allows the sputtered gold to form the actual circuit that connects the elements. This circuit formed by the sputtered gold is very thin (2–3 microns thick). To increase the thickness of the circuit, the metal mask is first removed. The module is then placed in an electroplating solution and gold is electroplated to the top of the thin sputtered connections. Because the surface of the array of elements is also somewhat conductive (but not as conductive as the thin gold sputtered connections) gold may electroplate to the surface of the module. However, the amount that may electroplate to the surface of the module should not be enough to connect adjacent elements (which would effectively short out the module) because the Kapton film separates each of the elements.

Other Materials Besides Gold

In the above-preferred embodiments, it was described how gold was sputtered onto the array of elements and also how gold tabs were applied to electrically connect the elements. Gold is the optimum material to be used for these types of modules since gold had demonstrated long life bonds with little or no degradation. However, it is possible to use other materials. Other materials that can be used include elements that are not strong telluride or selenide formers such as palladium and platinum. Nickel is unique as it is easy to weld and is used in the thermoelectric cooling industry as a contacting material, but when used at higher temperature in power modules it reacts with the bismuth telluride base material and the modules degrade within a few hundred hours. Ni—Al alloys, however, are much more resistive to degradation. Other materials that can be used are Al, Fe, and Co based alloys, but they are also reactive with the bismuth-telluride based materials. Cu and Ag based alloys are the worst as these elements are strong telluride and selenide formers and degrade performance.

Other Applications

There are many applications for the modules described above other than use in space with radioactive heat sources. Many modern electrical devices require extremely small amounts of electric power to operate. Other devices require more power for an extremely short period of time so a trickle charge at the rate of a few milliwatts may be sufficient to charge a rechargeable battery to operate the device for these short periods. The units should be very valuable whenever a very small and very reliable long-life generator is needed. The module's volume is only about 0.1 cubic inch. The module can be used with many low-power thermal heat sources. The units can be easily applied to generate small amounts of electricity from waste heat or from small burners in remote locations.

A unit 0.07-inch thick can also be used as a source of cooling. By applying 17 volts at the leads, the module will pump 1.47 watts of heat at a temperature difference of 35° C. This small unit could be used to cool integrated circuit chips or maintain laser diodes at a constant temperature.

Although the present invention has been described above in terms of specific embodiments, those skilled in the art will recognize many other potential embodiments of the present invention. Obviously, other cross sectional arrays are possible and as indicated there could be good reason for changing the length. The present invention is a small thermoelectric unit and the novel techniques are tailored to make modules with small elements. The elements do not, however, have to be as small as the ones in the preferred embodiments. Applicants expect that this technique will be useful in making modules with element cross sections in the range of about 0.0001 square inch to about 0.01 square inch. For high production rates, the contacts could be applied with a lithographic process using specially designed masks. Also, copper base 47 (FIGS. 2 and 4) could be fabricated from other materials such as aluminum. Therefore, the scope of the invention should be determined by the appended claims and their legal equivalents.

What is claimed is:

1. A thermoelectric module defining a hot side and a cold side, said module comprising:

A) a plurality of P-type thermoelectric elements,
B) a plurality of N-type thermoelectric elements, said P-type elements and said N-type elements being arranged in an array and insulated from each other with self adhering polyimide film,
C) a plurality of contacts on said cold side and said hot side connecting said elements in an electric circuit.

2. A module as in claim 1 wherein each of said contacts comprise a thin sputtered layer of gold and a gold tab welded over said sputtered layer.

3. A module as in claim 1 wherein each of said contacts comprise a thin sputtered layer of gold and a layer of gold electroplated over said sputtered layer.

4. A module as in claim 1 wherein each of said contacts comprise a thin sputtered layer of electrically conductive material and a layer of electrically conductive material electroplated over said sputtered layer.

5. A module as in claim 1 wherein each of said contacts comprise a thin sputtered layer of electrically conductive material and an electrically conductive tab welded over said sputtered layer.

6. A module as in claim 5 wherein both said electrically conductive material and said electrically conductive tab is a Ni—Al alloy.

7. A module as in claim 5 wherein both said electrically conductive material and said electrically conductive tab is chosen from a group consisting of: Au, Pd, Pt, Ni, Al, Fe and Co.

8. A module as in claim 1 wherein said N-type elements comprise bismuth telluride doped with iodoform and said P-type elements comprise bismuth telluride doped with lead.

9. A module as in claim 1 wherein each of said P-type element and each of said N-type element has a cross section of less than 0.01 square inch.

10. A module as in claim 1 wherein each of said P-type element and each of said N-type element has a cross section of less than about 0.0003 square inch.

11. A module as in claim 1 wherein each of said P-type element and each of said N-type element has a cross section of less than about 0.0003 square inch and a length of more than 0.5 inch and said plurality of elements number at least 100.

12. A module as in claim 11 wherein said elements number at least 324.

13. A module as in claim 1 wherein all elements are connected in series.

14. A module as in claim 1 wherein said elements are connected in a series-parallel circuit.

15. A method of making a small thermoelectric module comprising the steps of:
A) preparing a puck of N-type thermoelectric material,
B) preparing a puck of P-type thermoelectric material,
C) cutting thin plates from said N and P type pucks, to produce a plurality of N-type plates and a plurality of P-type plates,
D) stacking the plates to produce alternating layers of N and P type plates with a thin layer of self adhering polyimide insulator film between each layer of plates, to produce a stack of alternating insulated layers,
E) pressing the stack of alternating insulated layers in a hot press to produce a pressed stack of alternating insulated layers,
F) cutting thin plates from said pressed stack of alternating insulated layers to produce a plurality of insulated layered plates,
G) stacking the insulated layered plates to produce layers of insulated layered plates with a thin layer of self adhering polyimide insulator between each layer of insulated layered plates, to produce a stack of insulated layered plates in which each P-type layer is adjacent to a N-type layer but separated from it by said film of self adhering polyimide insulator film,
H) pressing the stack of insulated layers of layered plates in a hot press to produce a pressed stack of insulated layers of insulated layered plates, said pressed stack of insulated layers of insulated layered plates comprising an array of P-type and N-type thermoelectric elements arranged in a checkerboard pattern and defining a hot side and a cold side,
I) applying electrical contacts between P-type elements and N-type elements at said hot side and cold side to connect a plurality of said elements in an electric circuit, and
J) attaching at least two electrical leads at appropriate positions on said array of thermoelectric elements to produce a thermoelectric module.

16. A method as in claim 15 wherein said steps of preparing said N-type and P-type pucks comprise the following steps:
A) preparing a N-type alloy of a solid solution of $Bi_2Te_3$ and $Bi_2Se_3$ where the amount of $Bi_2Se_3$ is from 7 to 20 molecular percent, with a doping of about 0.1 percent iodoform by melting said $Bi_2Te_3$ and $Bi_2Se_3$ and iodoform in a quartz ampoule,
B) removing said alloy and grinding it in an inert gas glove box to produce a powder,
C) pressing said powder in a vacuum hot press to form an N-type puck,
D) preparing a P-type alloy of a solid solution of $Bi_2Te_3$ and $Sb_2Te_3$ and the amount of $Sb_2Te_3$ can vary from 70 to 90 molecular percent, with a doping of about 0.1 percent lead by melting said $Bi_2Te_3$ and $Sb_2Te_3$ and lead in a quartz ampoule,
E) removing said alloy and grinding it in an inert gas glove box to produce a powder,
F) pressing said powder in a vacuum hot press to form an P-type puck.

17. A method as in claim 15 wherein said contacts comprise gold tabs and said step of applying said contacts comprises the sub-steps of:
A) sputtering a thin layer that is a few microns thick of gold on said cold side and said hot side,
B) welding said gold tabs on top of said thin layer to make said contacts, and
C) blasting away said thin layer except where covered by said gold tabs.

18. A method as in claim 17 wherein said sub-step of welding said gold tabs is parallel gap welding said gold tabs.

19. A method as in claim 17 wherein said sub-step of welding said gold tabs is laser welding said gold tabs.

20. A method as in claim 19 wherein said sub-step of laser welding said gold tabs further includes a sub-step of covering said gold tabs with a transparent tool prior to said laser welding.

21. A method as in claim 15 wherein said contacts comprise gold tabs and said step of applying said contacts comprises the sub-steps of:
A) covering said cold side and said hot side with a mask,
B) sputtering a thin layer that is a few microns thick of gold through said mask onto said cold side and said hot side to form gold contact pads,
C) removing said mask from said cold side and said hot side, and
D) welding said gold tabs on top of said contact pads.

22. A method as in claim 15 wherein said step of applying said contacts comprises the sub-steps of:
- A) covering said cold side and said hot side with a mask,
- B) sputtering a thin layer that is a few microns thick of gold through said mask onto said cold side and said hot side to form an electric circuit, and
- C) removing said mask from said cold side and said hot side.

23. A method as in claim 22 further comprising the sub-step of electroplating the module after said mask is removed from said cold side and said hot side.

24. A method as in claim 15 wherein said contacts comprise gold tabs and said step of applying said contacts comprises the sub-steps of:
- A) covering a first side of said cold side and said hot side with photoresist,
- B) placing a pattern over said photoresist, wherein said pattern represents locations of gold contact pads,
- C) exposing said pattern covered photoresist to ultraviolet light to form a soluble photoresist portion and a hardened photoresist portion,
- D) removing said pattern,
- E) dissolving said soluble photoresist portion,
- F) sputtering a thin layer that is a few microns thick of gold through said hardened photoresist portion onto said first side to form said gold contact pads,
- G) dissolving said hardened photoresist portion,
- H) welding said gold tabs on top of said gold contact pads, and
- I) repeating steps A) through H) for a second side of cold side and said hot side.

25. A method as in claim 15 wherein said step of applying said contacts comprises the sub-steps of:
- A) covering a first side of said cold side and said hot side with photoresist,
- B) placing a pattern over said photoresist, wherein said pattern represents locations of an electric circuit connecting said elements,
- C) exposing said pattern covered photoresist to ultraviolet light to form a soluble photoresist portion and a hardened photoresist portion,
- D) removing said pattern,
- E) dissolving said soluble photoresist portion,
- F) sputtering a thin layer that is a few microns thick of gold through said hardened photoresist portion onto first side to form said electric circuit,
- G) dissolving said hardened photoresist portion, and
- H) repeating steps A) through G) for a second of said cold side and said hot side.

26. A method as in claim 25 further comprising the sub-step of electroplating the module after dissolving said hardened photoresist portion.

27. An electric generation unit comprising:
- A) a thermoelectric module defining a hot side and a cold side, said module comprising:
  1) a plurality of P-type thermoelectric elements,
  2) a plurality of N-type thermoelectric elements, said P-type elements and said N-type elements being arranged in an array and insulated from each other with self adhering polyimide film,
  3) a plurality of contacts on said cold side and said hot side connecting said elements in an electric circuit, and
  4) at least two electrical leads attached to said array;
- B) a heat source positioned adjacent to said hot side.

28. An electric generator as in claim 27 wherein each of said P-type element and each of said N-type element has a cross section of less than 0.01 square inch.

29. An electric generator as in claim 28 wherein said elements number at least 324.

30. An electric generator as in claim 27 wherein each of said P-type element and each of said N type element has a cross section of less than about 0.0003 square inch.

31. An electric generator as in claim 27 wherein each of said P-type element and each of said N type element has a cross section of less than about 0.0003 square inch and a length of more than 0.5 inch and said plurality of elements number at least 100.

* * * * *